(12) United States Patent
Beroz

(10) Patent No.: US 9,805,891 B2
(45) Date of Patent: Oct. 31, 2017

(54) MULTIPLEXING, SWITCHING AND TESTING DEVICES AND METHODS USING FLUID PRESSURE

(71) Applicant: ComponentZee, LLC, Apex, NC (US)

(72) Inventor: Masud Beroz, Apex, NC (US)

(73) Assignee: Componentzee, LLC, Apex, NC (US)

( * ) Notice: Subject to any disclaimer, the term of this patent is extended or adjusted under 35 U.S.C. 154(b) by 167 days.

(21) Appl. No.: 14/921,030

(22) Filed: Oct. 23, 2015

(65) Prior Publication Data

US 2016/0118210 A1 Apr. 28, 2016

Related U.S. Application Data

(60) Provisional application No. 62/068,663, filed on Oct. 25, 2014, provisional application No. 62/069,843, filed on Oct. 29, 2014, provisional application No. 62/076,072, filed on Nov. 6, 2014, provisional application No. 62/077,941, filed on Nov. 11, 2014, provisional application No. 62/079,255, filed on Nov. 13, 2014, provisional application No. 62/080,434, (Continued)

(51) Int. Cl.
| | | |
|---|---|---|
| *G01R 31/20* | (2006.01) | |
| *H01H 35/26* | (2006.01) | |
| *G01R 31/26* | (2014.01) | |
| *G01R 1/067* | (2006.01) | |
| *G01R 1/073* | (2006.01) | |

(52) U.S. Cl.
CPC ......... *H01H 35/26* (2013.01); *G01R 1/06716* (2013.01); *G01R 1/06727* (2013.01); *G01R 1/0735* (2013.01); *G01R 31/2635* (2013.01); *H01H 2221/002* (2013.01)

(58) Field of Classification Search
CPC ............ G01R 31/2891; G01R 31/2887; G01R 31/2635; G01R 31/2886; G01R 1/0408; G01R 1/0735; G01R 1/0491; H01R 12/73; H01R 12/714; H01R 13/03; H01R 13/2407; H01R 13/2435
See application file for complete search history.

(56) References Cited

U.S. PATENT DOCUMENTS

| | | | |
|---|---|---|---|
| 4,820,976 A * | 4/1989 | Brown ................. | G01R 1/0408 324/72.5 |
| 5,550,482 A | 8/1996 | Sano | |

(Continued)

*Primary Examiner* — Minh N Tang
(74) *Attorney, Agent, or Firm* — NC Patent Law, PLLC

(57) ABSTRACT

A fluid pressure actuated device for establishing electrical contact includes a first side and a second side each defining a respective cavity. A respective flexible membrane is positioned across each cavity. Each membrane has an outer side that carries an electrically conducting contactor. The contactors are electrically connected to a conducting connector that extends at least partially through the device. Each flexible membrane extends and withdraws moving the associated electrically conducting contactor in opposing directions when fluid pressure is increased and decreased in the associated cavity. Each membrane may have an undulating shape by including concentric frustum portions that narrow in opposite directions. The contacts may have neutral positions that are internal relative to outer surfaces of the device until fluid pressure is increased in the respective cavities causing extension by movement of the membranes.

20 Claims, 13 Drawing Sheets

Related U.S. Application Data filed on Nov. 17, 2014, provisional application No. 62/080,435, filed on Nov. 17, 2014, provisional application No. 62/128,495, filed on Mar. 4, 2015.

(56) References Cited

U.S. PATENT DOCUMENTS

| | | |
|---|---|---|
| 5,604,446 A | 2/1997 | Sano |
| 5,869,974 A | 2/1999 | Akram et al. |
| 6,072,321 A | 6/2000 | Akram et al. |
| 6,717,422 B2 * | 4/2004 | Akram ................ G01R 1/0483 324/750.16 |
| 7,195,503 B2 | 3/2007 | Eldridge |
| 7,455,540 B2 | 11/2008 | Eldridge |
| 7,541,801 B2 | 6/2009 | Nagasaka et al. |
| 7,576,553 B2 | 8/2009 | Lou et al. |
| 7,967,621 B2 | 6/2011 | Eldridge |
| 8,803,539 B2 | 8/2014 | Rathburn |
| 9,577,358 B2 * | 2/2017 | Beroz ................ H01R 12/714 |
| 2011/0316576 A1 | 12/2011 | Kataoka et al. |
| 2012/0194213 A1 | 8/2012 | Komatsu et al. |

\* cited by examiner

MULTIPLEXING, SWITCHING AND TESTING DEVICES AND METHODS USING FLUID PRESSURE

CROSS-REFERENCE TO RELATED APPLICATION

This application claims the benefit of priority of U.S. provisional patent application No. 62/068,663, titled "Fluid Pressure Activated High Density Wafer Testing Probe Card" filed on Oct. 25, 2014. This application also claims the benefit of priority of U.S. provisional patent application No. 62/069,843, titled "Fluid Pressure Activated High Density Wafer Testing Probe Card and Test Socket," filed on Oct. 29, 2014. This application also claims the benefit of priority of U.S. provisional patent application No. 62/076,072, titled "Fluid Pressure Activated Wafer Level Probe Card/Burn-in/Test Socket Using Fluid Pressure as Source of Potential Energy for the Application and Control of the Desired Contact Force/Pressure," filed on Nov. 6, 2014. This application also claims the benefit of priority of U.S. provisional patent application No. 62/077,941, titled "High Density LED Wafer Level Testing and Sorting Probe Card Contactor," filed on Nov. 11, 2014. This application also claims the benefit of priority of U.S. provisional patent application No. 62/079,255, titled "High Density LED Wafer Level Testing and Sorting Probe Card Contactor and LED Color Testing Improvements," filed on Nov. 13, 2014. This application also claims the benefit of priority of U.S. provisional patent application No. 62/080,434, titled "Quick Connect/Disconnect for Robotics and Industrial Applications Using Fluid Pressure as a Contact Force," filed on Nov. 17, 2014. This application also claims the benefit of priority of U.S. provisional patent application No. 62/080,435, titled "Using a Multiplexer Switching Device or Double Face Test to Reduce the Number of Routing Conduits," filed on Nov. 17, 2014. This application also claims the benefit of priority of U.S. provisional patent application No. 62/128,495, titled "Using Fluid Pressure as Multiplexing or Switching Device," filed on Mar. 4, 2015. Each above-referenced provisional patent application is incorporated herein in its entirety by this reference. Furthermore, U.S. non-provisional patent application Ser. No. 14/723,412, titled "Fluid Pressure Activated Electrical Contact Devices and Methods," filed on May 27, 2015, now U.S. Pat. No. 9,577,358, is incorporated herein in its entirety by this reference.

TECHNICAL FIELD

The present disclosure relates to generalities devices with electrical contacts. More particularly, the present disclosure relates to fluid pressure actuated devices having fluid pressure actuated electrical contacts for switching, multiplexing, and testing other devices

BACKGROUND

Electronic devices fabricated of semiconductor materials, such as light emitting diodes, are typically tested before being placed in consumer and commercial electronics devices. Many devices in the current marketplace contain dozens or more semiconductor-based devices, all of which should be tested before installation. Much of the cost of such devices is related to the cost of testing.

As the world market sales for electronic devices reaches and surpasses hundreds of billions (USD), the costs of testing reaches and surpasses tens of billions. As consumers apply commodity pricing expectations to a growing list of established trusted brand names, the criticality of reliable and cost competitive testing equipment scales with the size of the market.

Before final assembly of an electronics consumer device in which hundreds and even thousands of components are needed, each component may need to be tested. If even one single component is defective the device may be rendered useless. Components within such devices are commonly made in close proximity on small chips. Hundreds or even thousands of electrical contact electrodes can be present on a single chip, and most or all of these contact electrodes needs to be tested or contacted to apply power and ground signals during the test. By current technology, as further described below, most or all of the contacts are to be touched and tested simultaneously. Given the small size and staggering number of contacts on a given wafer, the demands for precision and reliability placed on testing equipment is high.

SUMMARY

This Summary is provided to introduce in a simplified form concepts that are further described in the following detailed descriptions. This summary is not intended to identify key features or essential features of the claimed subject matter, nor is it to be construed as limiting the scope of the claimed subject matter.

In at least one embodiment, a fluid pressure actuated device for establishing electrical contact includes: a first substrate side defining a first cavity; a first flexible membrane positioned across the first cavity, the first flexible membrane having an outer side facing a first direction away from the first substrate side, the first flexible membrane having an inner side facing into the first cavity in a second direction opposite the first direction; and an electrically conducting first contactor mounted on the outer side of the first flexible membrane; a second substrate side defining a second cavity; a second flexible membrane positioned across the second cavity, the second flexible membrane having an outer side facing the second direction away from the second substrate side, the second flexible membrane having an inner side facing into the second cavity in the first direction; and an electrically conducting second contactor mounted on the outer side of the second flexible membrane, wherein the first flexible membrane extends and withdraws moving the electrically conducting first contactor in the first direction and second direction respectively when fluid pressure is increased and decreased in the first cavity, and wherein the second flexible membrane extends and withdraws moving the electrically conducting second contactor in the second direction and first direction respectively when fluid pressure is increased and decreased in the second cavity.

In at least one example, the first flexible membrane has an undulating shape.

In at least one example, the first flexible membrane includes at least one frustum portion.

In at least one example, the first flexible membrane includes at least two concentric frustum portions that narrow in opposite directions.

In at least one example, the fluid pressure actuated device further includes an electrically conducting connector in electrical communication with the first contactor and in electrical communication with the second contactor.

In at least one example, the electrically conducting connector extends in the first and second directions.

In at least one example, the fluid pressure actuated device further includes: a third cavity formed in the first substrate side; a third flexible membrane disposed across the third cavity, the third flexible membrane having an outer side facing the first direction away from the first substrate side, the third flexible membrane having an inner side facing into the third cavity in the second direction; and an electrically conducting third contactor mounted on the outer side of the third flexible membrane, the third contactor in electrical communication with the electrically conducting connector, wherein the third flexible membrane extends and withdraws moving the electrically conducting third contactor in the first direction and second direction respectively when fluid pressure is increased and decreased in the third cavity.

In at least one example, the fluid pressure actuated device has a first outer surface facing the first direction, and the first contactor has a neutral position in which the first contactor is positioned internally relative to the first outer surface until pressure is increased in the first cavity.

In at least one example, the fluid pressure actuated device further includes an electrically insulating cover layer between at least the electrically conducting connector and the first outer surface.

In at least one example, the electrically insulating cover layer defines the first outer surface.

In at least one example, when electrical signals are applied simultaneously to the first contactor and the third contactor, the electrically conducting connector mixes the signals and conveys a mixed signal to the second contactor.

In at least one example, the fluid pressure actuated device is configured to test a light-emitting diode.

In at least one example, the fluid pressure actuated device further includes: an electrically conducting first connector in electrical communication with the first contactor and in electrical communication with the second contactor; an image sensor in which current is induced upon the image sensor being illuminated, the image sensor facing the first direction; a third cavity formed in the second substrate side; a third flexible membrane disposed across the third cavity, the third flexible membrane having an outer side facing the second direction away from the second substrate side, the third flexible membrane having an inner side facing into the third cavity in the first direction; an electrically conducting third contactor mounted on the outer side of the third flexible membrane; and an electrically conducting second connector in electrical communication with image sensor and the third contactor, the second connector electrically isolated from the first connector.

In at least one embodiment, a fluid pressure actuated device for testing a light-emitting diode includes: a first substrate side defining a first cavity; a first flexible membrane disposed across the first cavity, the first flexible membrane having an outer side facing a first direction away from the first substrate side, the first flexible membrane having an inner side facing into the first cavity in a second direction opposite the first direction; and an electrically conducting first contactor mounted on the outer side of the first flexible membrane; a second substrate side defining a second cavity; a second flexible membrane disposed across the first cavity, the second flexible membrane having an outer side facing the second direction away from the second substrate side, the second flexible membrane having an inner side facing into the second cavity in the first direction; and an electrically conducting second contactor mounted on the outer side of the second flexible membrane; an electrically conducting first connector in electrical communication with the first contactor and in electrical communication with the second contactor; a first image sensor in which current is induced upon the image sensor being illuminated, the image sensor facing the first direction; a third cavity formed in the second substrate side; a third flexible membrane disposed across the third cavity, the third flexible membrane having an outer side facing the second direction away from the second substrate side, the third flexible membrane having an inner side facing into the third cavity in the first direction; an electrically conducting third contactor mounted on the outer side of the third flexible membrane; and an electrically conducting second connector in electrical communication with the first image sensor and the third contactor, the second connector electrically isolated from the first connector.

In at least one example, the first flexible membrane has an undulating shape.

In at least one example, the first flexible membrane includes at least two concentric frustum portions that narrow in opposite directions.

In at least one example, the fluid pressure actuated device has a first outer surface facing the first direction, and the first contactor has a neutral position in which the first contactor is positioned internally relative to the first outer surface until pressure is increased in the first cavity.

In at least one example, the electrically insulating cover layer defines the first outer surface.

In at least one example, the first contactor delivers electrical power to a light emitting diode from the second contactor via the first connector.

In at least one example, the fluid pressure actuated device further includes a second image sensor optically isolated from the first image sensor.

BRIEF DESCRIPTION OF THE DRAWINGS

The previous summary and the following detailed descriptions are to be read in view of the drawings, which illustrate particular exemplary embodiments and features as briefly described below. The summary and detailed descriptions, however, are not limited to only those embodiments and features explicitly illustrated.

DETAILED DESCRIPTIONS

Figure 1:
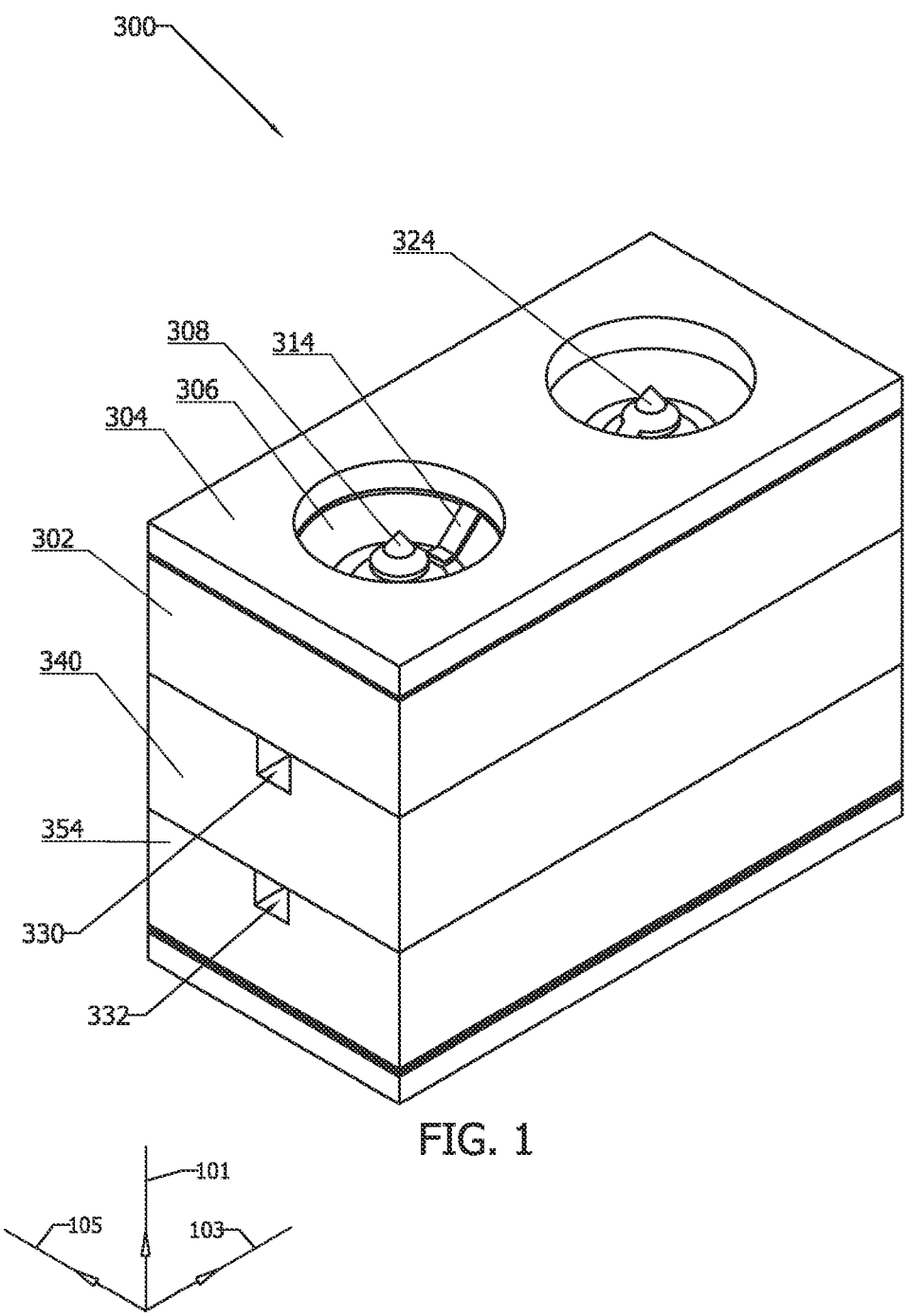
FIG. 1 is an isometric perspective view of a switching and multiplexing device according to at least one embodiment.

These descriptions are presented with sufficient details to provide an understanding of one or more particular embodiments of broader inventive subject matters. These descriptions expound upon and exemplify particular features of those particular embodiments without limiting the inventive subject matters to the explicitly described embodiments and features. Considerations in view of these descriptions will likely give rise to additional and similar embodiments and features without departing from the scope of the inventive subject matters. Although the term "step" may be expressly used or implied relating to features of processes or methods, no implication is made of any particular order or sequence among such expressed or implied steps unless an order or sequence is explicitly stated.

Any dimensions expressed or implied in the drawings and these descriptions are provided for exemplary purposes. Thus, not all embodiments within the scope of the drawings and these descriptions are made according to such exemplary dimensions. The drawings are not made necessarily to scale. Thus, not all embodiments within the scope of the drawings and these descriptions are made according to the apparent scale of the drawings with regard to relative dimensions in the drawings. However, for each drawing, at least one embodiment is made according to the apparent relative scale of the drawing. Like reference numbers used throughout the drawings depict like or similar elements.

References to elements as upper, lower, left-side and right-side are made in these descriptions with respect to the illustrated orientations of structures and features in the drawings. Features described such as facing up or down and as extending up or down are not limited in fabrication, testing, or use to any absolute vertical or other orientation.

FIG. 1 is an isometric perspective view of a switching and multiplexing device 300 according to at least one embodiment. The device 300 has an upper substrate 302 and a lower substrate 354, each of which may be formed of Type I material. An upper electrically insulating cover layer or spacer 304, which may be constructed of Type II material, defines the upper surface of the device 300 in FIGS. 1-4. A lower electrically insulating cover layer or spacer 356, which may be constructed of Type II material, defines the lower surface of the device 300 in FIGS. 1-4.

Figure 2:
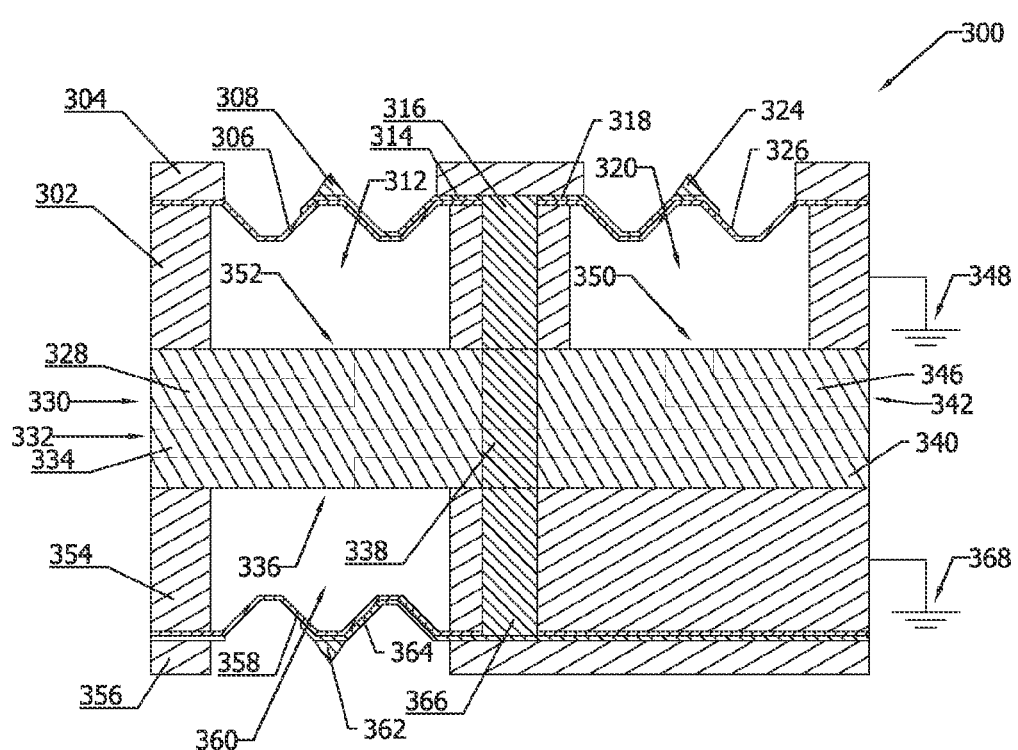
FIG. 2 is a cross sectional view of the device illustrated in FIG. 1.
Figure 2:
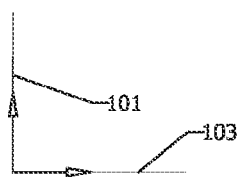
Figure 3:
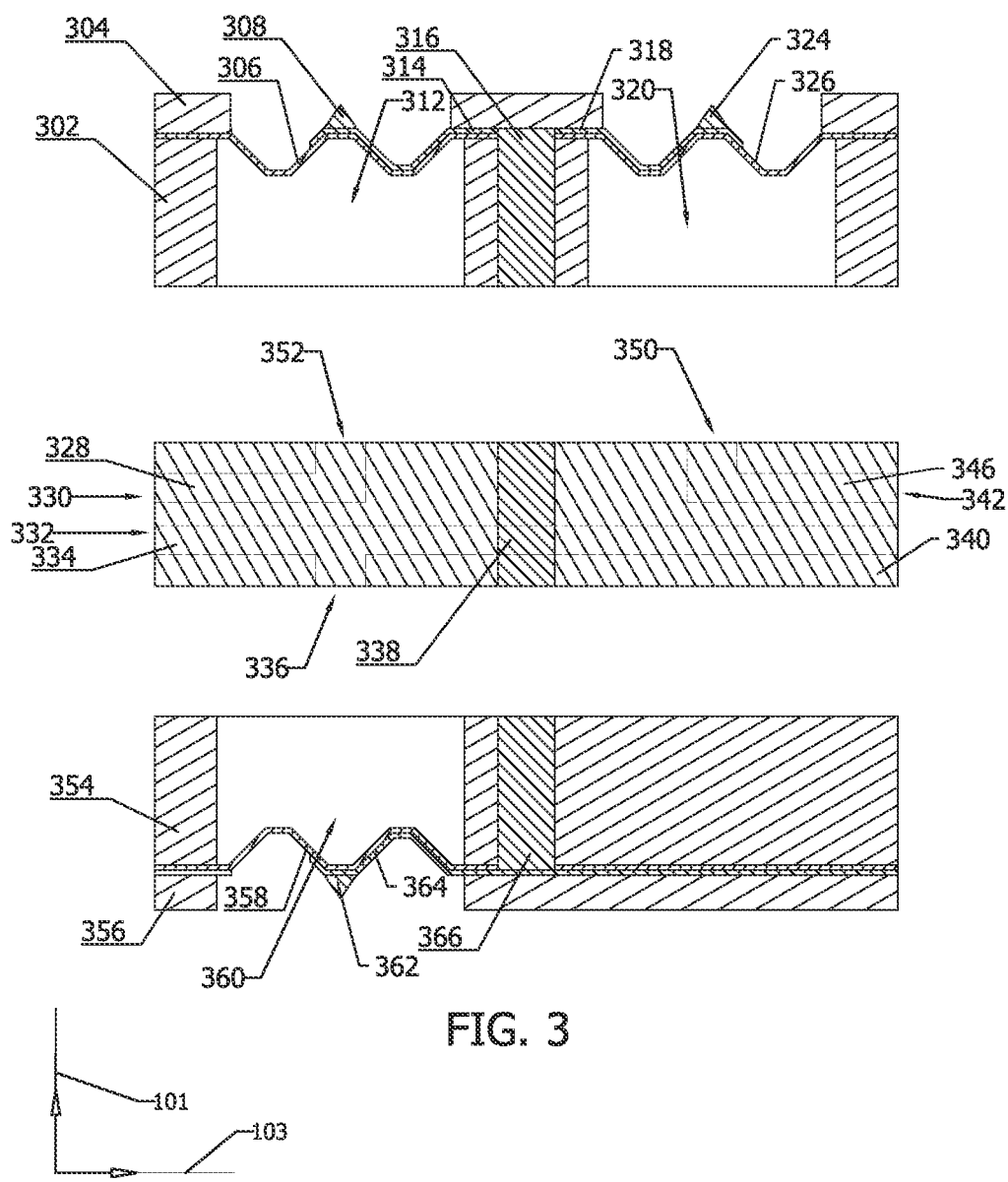
FIG. 3 is an exploded cross-sectional view of the device of FIGS. 1 and 2.
Figure 4:
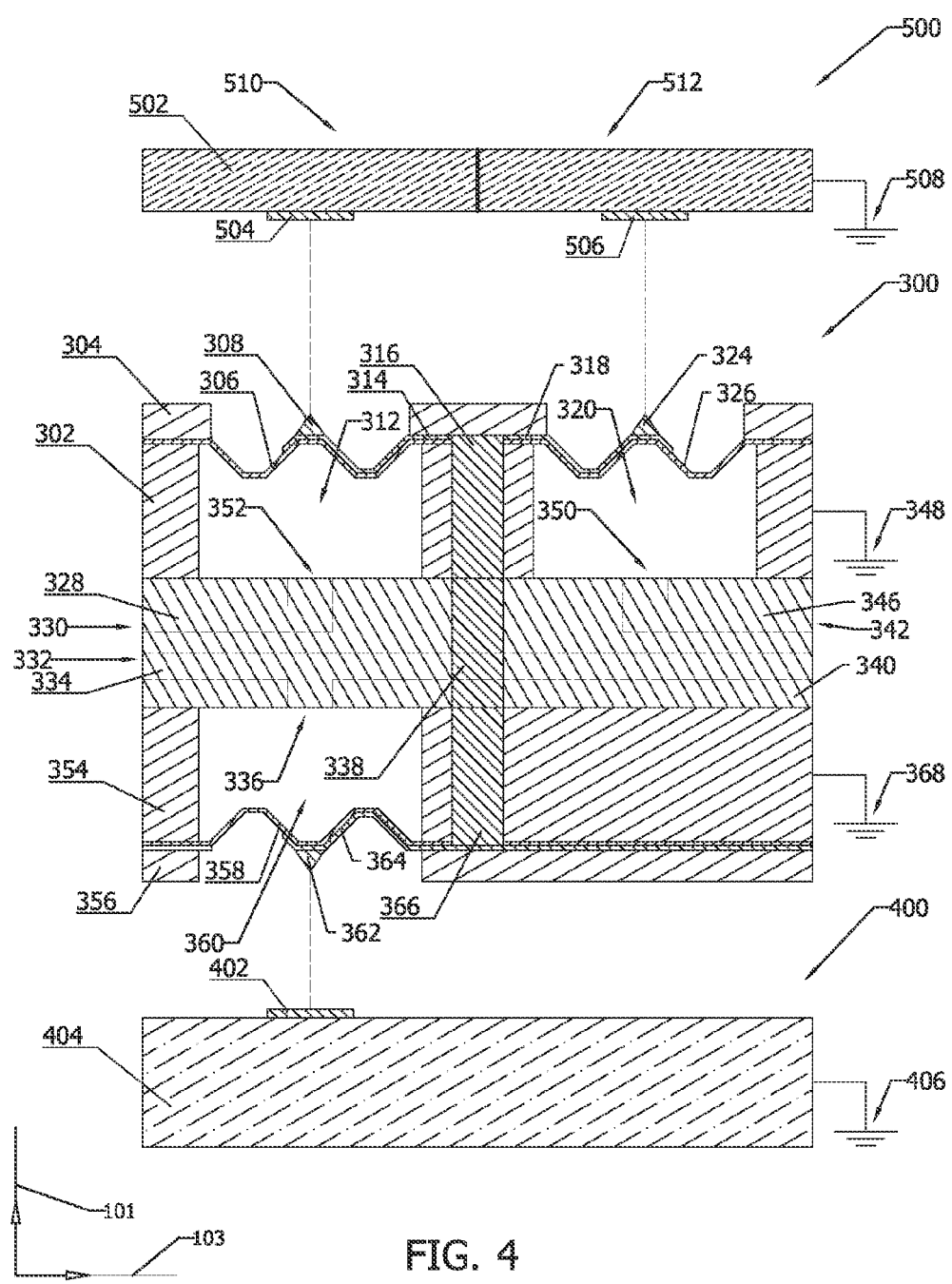
FIG. 4 is a cross-sectional view of set up for testing of a device or structure using the switching and multiplexing device of FIGS. 1-3.

Upper electrical contactors 308 and 324, which may be formed of Type III material, move according to fluid pressure applied to the device at least partially in upward and downward Z directions, with reference to a Z-axis 101, which is normal to the upper surface, whereas directions perpendicular to the Z-axis 101 can be described as having X-axis 103 and Y-axis 105 components. In FIGS. 2-4, the Y-axis should be considered as extending into the page of the drawings, such that the Z-axis 101, X-axis 103 and Y-axis 105 constitute a set of mutually orthogonal axes upon which convenient spatial descriptions are based in the following.

Flexible membranes 306 and 326 (FIG. 2), which may be formed of Type II material, respond to the fluid pressure applied, and respectively carry the contactors 308 and 324. Flexible conducting traces 314 and 318, which may be formed of Type III material, extend respectively along the outer faces of the membranes 306 and 326 to provide electrical contact to the contactors 308 and 324.

Each flexible membrane 306 and 326 is advantageously formed as having a waving or undulating shape, which provides a greater range of motion of the contactors 308 and 324 than would likely be possible with a simple planar membrane. Below the position of each contactor 308 and 324, the respective flexible membrane 306 and 326 has a central frustum portion having its tapering apex or narrowing end extending or directed outward from the device 300. Each flexible membrane 306 and 326 has an intermediate frustum portion that is concentric with and circumferentially encircles or surrounds the central frustum portion. The intermediate frustum portion has a tapering narrowing end extending or directed inward. The central frustum portion and intermediate frustum portion at least partially overlap along the Z-axis 101 such that the central frustum portion is at least partially nested within the intermediate frustum portion in at least the neutral position of the membrane in FIGS. 1-4.

A substrate body 340 lies between the upper substrate 302 and lower substrate 354. Openings 330, 332 and 342 (FIG. 2) are formed in the substrate body 340 to permit fluid pressure application to micro-fluidic channels formed in the substrate body, which may be formed of Type I material.

FIG. 2 is a cross sectional view of the device 300 illustrated in FIG. 1. FIG. 3 is an exploded cross-sectional view of the device 300 of FIGS. 1 and 2. The electrical contactors 308 and 324 along the upper side of the device 300 are movable. A lower electrical contactor 362 along the lower side of the device 300 is arranged on a lower membrane 358, which is constructed similarly to the upper side flexible membranes 306 and 326. A flexible conducting trace 364, which may be formed of Type III material, extends along the outer face of the lower membrane 358 to provide electrical contact to the electrical contactor 362. Ground connections 348 and 368 generally ground the device 300 or serve to provide an electrical circuit upon application of electrical signals to the device 300.

The membranes 306, 326 and 358 reside respectively over chambers or cavities 312, 320 and 360, which respectively are connected to the micro-fluidic channels 328, 346, and 334, which in turn connect to different micro-fluidic pressure sources in at least one embodiment. Cavities 312, 320 and 360 are connected to the respective micro-fluidic channels through openings 352, 350 and 336.

Each conducting trace 314, 318 and 364 extends from a conducting or conductively plated pass-through connector 338, which has an upper portion 316 and a lower portion 366. The pass-through connector 338 may be formed of Type III material, to a corresponding contactor 308, 324 and 362. The conducting pass-through connector 338 provides a common electrical connection among the contactors 308, 324 and 362 in the illustrated embodiment. FIG. 3 is an exploded cross-sectional view of the device 300 of FIGS. 1 and 2.

FIG. 4 is a cross-sectional view of set up for testing of a device or structure 500 using the switching and multiplexing device 300 of FIGS. 1-3. In the illustrated example, the device or structure 500 has a semiconductor substrate 502. In particular, the device or structure 500 is illustrated as a semiconductor wafer having adjacent dice 510 and 512 under test. Respective signal electrodes 504 and 506 of the dice 510 and 512 face the switching and multiplexing device 300. A ground connection 508 generally grounds the structure 500 or serves to provide an electrical circuit path upon application of electrical signals. The signal electrodes 504 and 506 are positioned to align with the contactors 308 and 324 of the switching and multiplexing device 300. The signal electrodes 504 and 506 are electrically connected by each being connected to the connector 338. Contactors 308 and 324 are shorted. When we intend to utilize the signal from signal electrode 504, then the pressure in cavity 312 is positive, which brings contactor 308 in contact with signal electrode 504. At the same time negative pressure or no pressure is applied to cavity 324, to prevent the signal from the signal electrode 506 to get to the DUT board electrode pad 402. So in case of using the device for a switching or muliplexing device, at one time either electrode 504 gets connected to electrode 402, or electrode 506 gets connected to electrode 402, however if the device is used as a mixer, pressure in both cavities 312 and 320 is positive so signal from both electrodes 504 and 506 are conveyed to 402 at the same time together and brought into electrical connection with the conducting pass-through connector 338.

In the illustrated example of FIG. 4, the switching and multiplexing device 300 is positioned between the device or structure 500 and a device under test (DUT) board 400. The substrate 404 of the DUT board 400 may include one or more layers of electrical routing. The structure 400 can also be a functioning motherboard of an electrical system in the FIG. 4 illustration. The DUT board or structure 400 can be connected to additional testing equipment or interconnecting equipment. A ground connection 406 generally grounds the DUT board or structure 400 or serves to provide an electrical circuit upon application of electrical signals to the signal contact electrode 402. The signal electrode 402 is positioned to align with the lower contactor 362 of the switching and multiplexing device 300. Upon electrical contact with the contactor 362, the signal electrode 402 is brought into electrical connection with the conducting pass-through connector 338.

In FIG. 4, the device 300 can be a probe card contactor, with added switching and multiplexing capability. In use, the device 300 is pressed between the device or structure 500 and the board 400. In at least one example, the board 400 serves as a signal source for testing of the device or structure 500, with the switching and multiplexing device 300 serving to controllably connect, switch and route signals between the board 400 and the device or structure 500.

At the time of full physical contact of both the top and bottom surfaces of the device 300, each contacting the respective device or structure 500 and the DUT board 400, electrical contacts of the signal electrodes 504 and 506 with the contactors 308 and 324 of the switching and multiplexing device 300 are not immediately established with the upper side flexible membranes 306 and 326 in their neutral positions as shown in FIG. 4. Similarly, the signal electrode 402 of the DUT board 400 does not contact the electrical contactor 362 with the lower membrane 358 in its neutral position. The tips of the upper contactors 308 and 324 are positioned below the upper electrically insulating cover layer or spacer 304 that defines the upper surface of the device 300.

Similarly, the outer tip of the lower electrical contactor 362 resides within the device relative to the lower electrically insulating cover layer or spacer 356 when the lower membrane 358 is in its neutral position. That is, in the illustrated embodiment, the tips of the contactors 308, 324 and 362 are positioned in or withdrawn into the device 300 until fluid pressure is introduced into cavities 312, 320 and 360 respectively through channels 328, 346 and 334 and cavity openings 352, 350 and 336. To establish electrical connections, at once, in any order, or according to any sequence of operations, fluid pressure is introduced into cavities 312, 320 and 360 to cause extension of the flexible membranes 306, 326 and 358 thus carrying the tips of the contactors 308, 324 and 362 outward from the device 300 and into electrical contact with respective signal electrodes 504, 506 and 402. The flexible membranes 306, 326 and 358 can be actuated independently or together in any combination.

For use of the device 300 as a mixer in FIG. 4, the cavities 312, 320 and 360 are pressurized equally and due to the pressure increase in those cavities, the flexible membranes 306, 326 and 358 move outward to establish electrical contact with the signal electrode pads 504, 506 and 402. Signals coming from the signal electrodes 504 and 506 of the device or structure 500 are mixed and transferred to the signal electrode 402 through the device 300 via the conducting pass-through connector 338. In real time application some degree of shaping, filtering, passive decoupling and/or other transient effects might occur between each pair or contacting electrodes.

For use of the device 300 as a switch and multiplexing device as in FIG. 4, various signal routing capabilities are possible. Assuming the structures 500, 300 and 400 are in physical contact, to transmit a signal exclusively from the signal electrode 504 to the signal electrode 402, slight negative pressure can be introduced into the cavity 320 preventing the right-side upper contactor 324 from connecting to the signal electrode 506. At once, or in any order, positive pressure can be introduced into the cavities 312 and 360 to establish connection of the left-side upper contactor 308 with the signal electrode 504 and connection of the lower contactor 362 with the signal electrode 402.

Conversely, to transfer a signal exclusively from the right-side signal electrode 506 of the device or structure 500 to the signal electrode 402 of the board 400, positive pressure can be applied in cavities 320 and 360 while negative pressure is applied in the cavity 312. Positive and negative pressures described here relate to sufficient pressure increase and pressure decrease to respectively extend and withdraw an affected membrane. These examples demonstrate that these and other signal routing capabilities are provided by the device 300.

Many advantages are thus provided by the switching and multiplexing device 300. In some arrangements, signal pads are closely packed on a semiconductor wafer or on an expensive high-definition circuit board, which may be represented by the device or structure 500. On the other hand FR4 mother boards and DUT boards 400 typically have scarcely packed signal pads due to cost and technical limitation. In testing semiconductor wafer devices in a burn-in chamber at the wafer level, quite often because of routing limitations of the DUT board 400, all of the dice cannot be tested at once due to signal routing limitations. Instead one can cluster together respective contactors on the probe card contactor device 300.

Figure 5B:
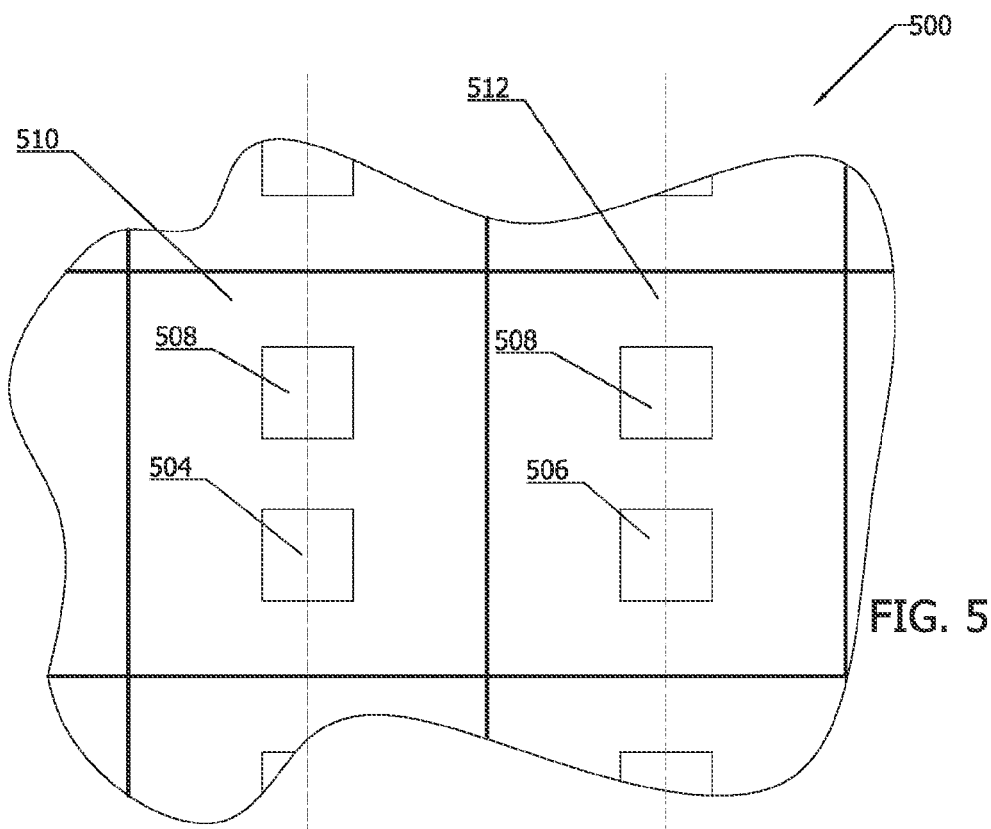
FIG. 5B is a plan view of a portion the lower side of the device or structure of FIG. 5A.
Figure 5A:
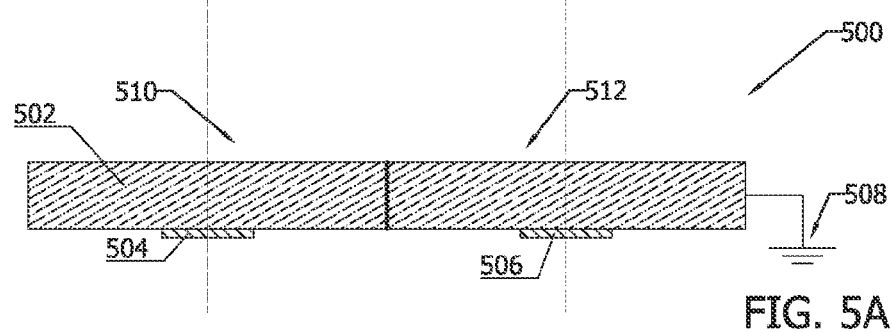
FIG. 5A is a separate cross-sectional view of the device or structure under testing in FIG. 4.

FIG. 5A is a separate cross-sectional view of the device or structure 500 under testing in FIG. 4. FIG. 5B is a plan view of a portion the lower side of the device or structure 500 of FIG. 5A. The portion illustrated in FIG. 5B has two dice 510 and 512 on a wafer, where the corresponding signal and ground pads are shorted on the contactor substrate. Advantageously, many or all the dice on a single probe card may be tested with only one maintained physical touchdown with the device 300. The wafer's electrical performance may be tested during burn-in and accelerated environmental and load tests. During test and burn in procedures, while the wafer and the device 300 are still in full physical contact, the signals from the electrode pads 504 and 506 can be measured one at a time by varying the pressure in cavities 312 and 320 (FIG. 4).

Figure 6:
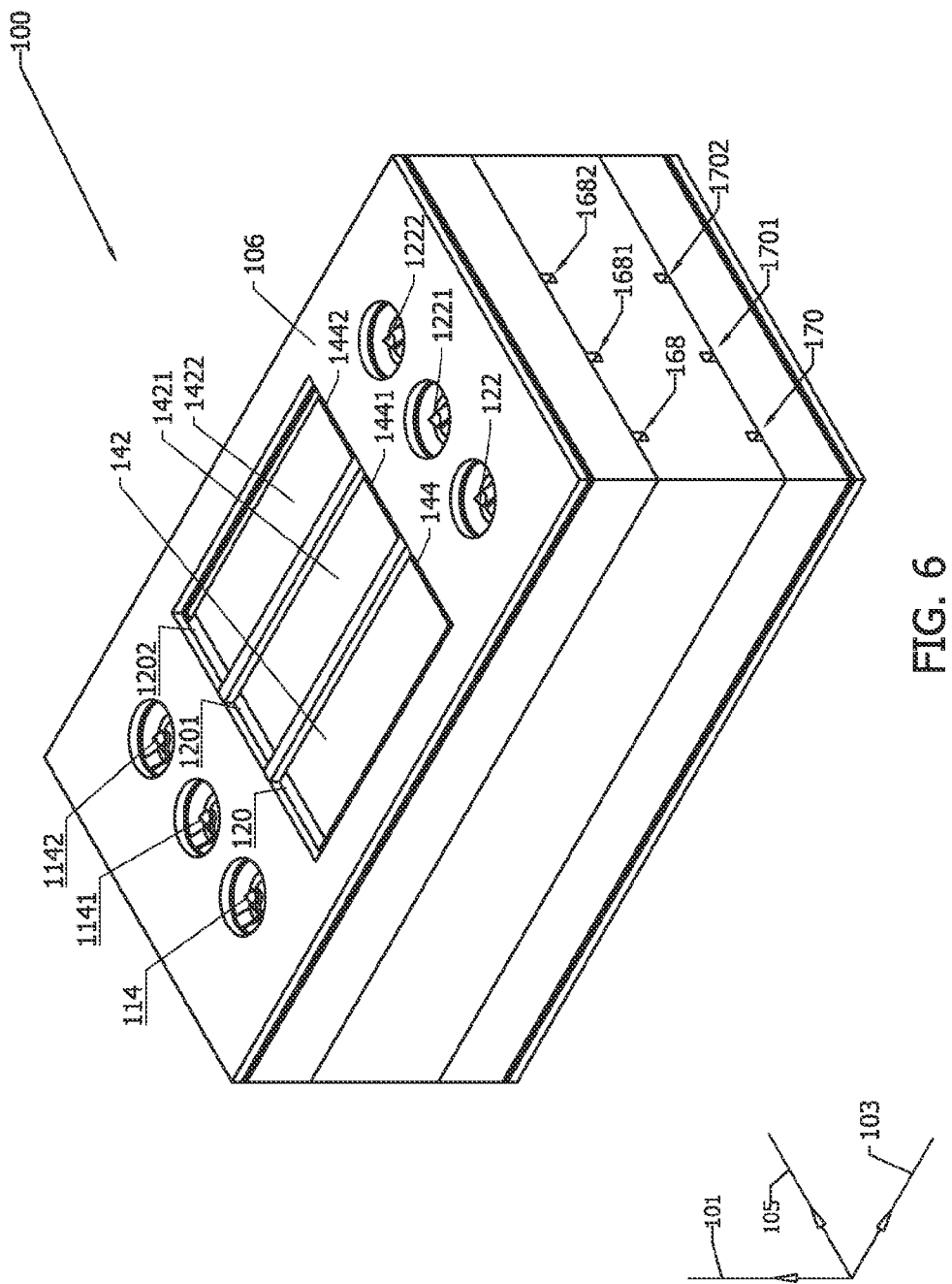
FIG. 6 is an upper-side isometric perspective view of a probe card for testing LED functionality.
Figure 7:
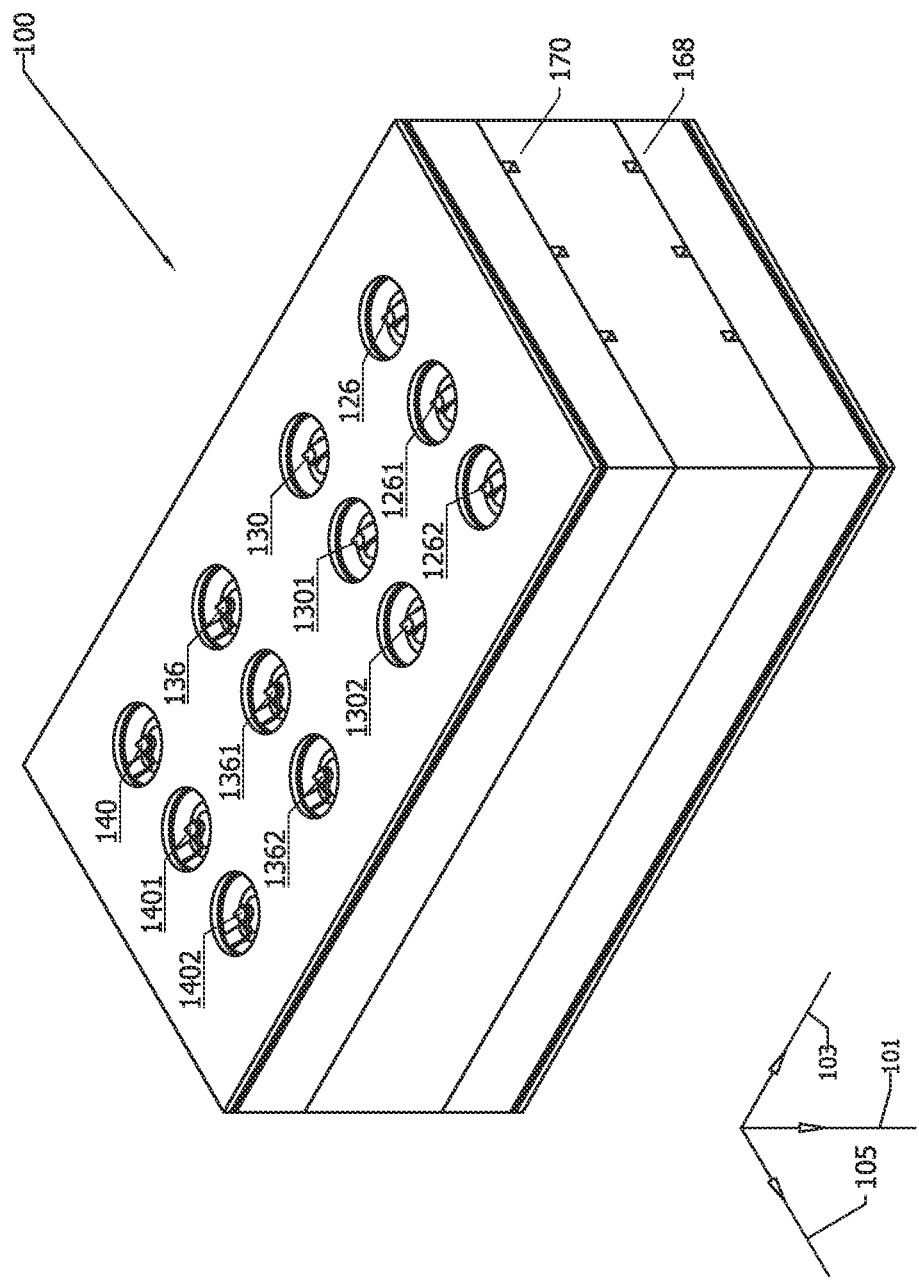
FIG. 7 is a lower-side isometric perspective view of the probe card of FIG. 6.
Figure 8:
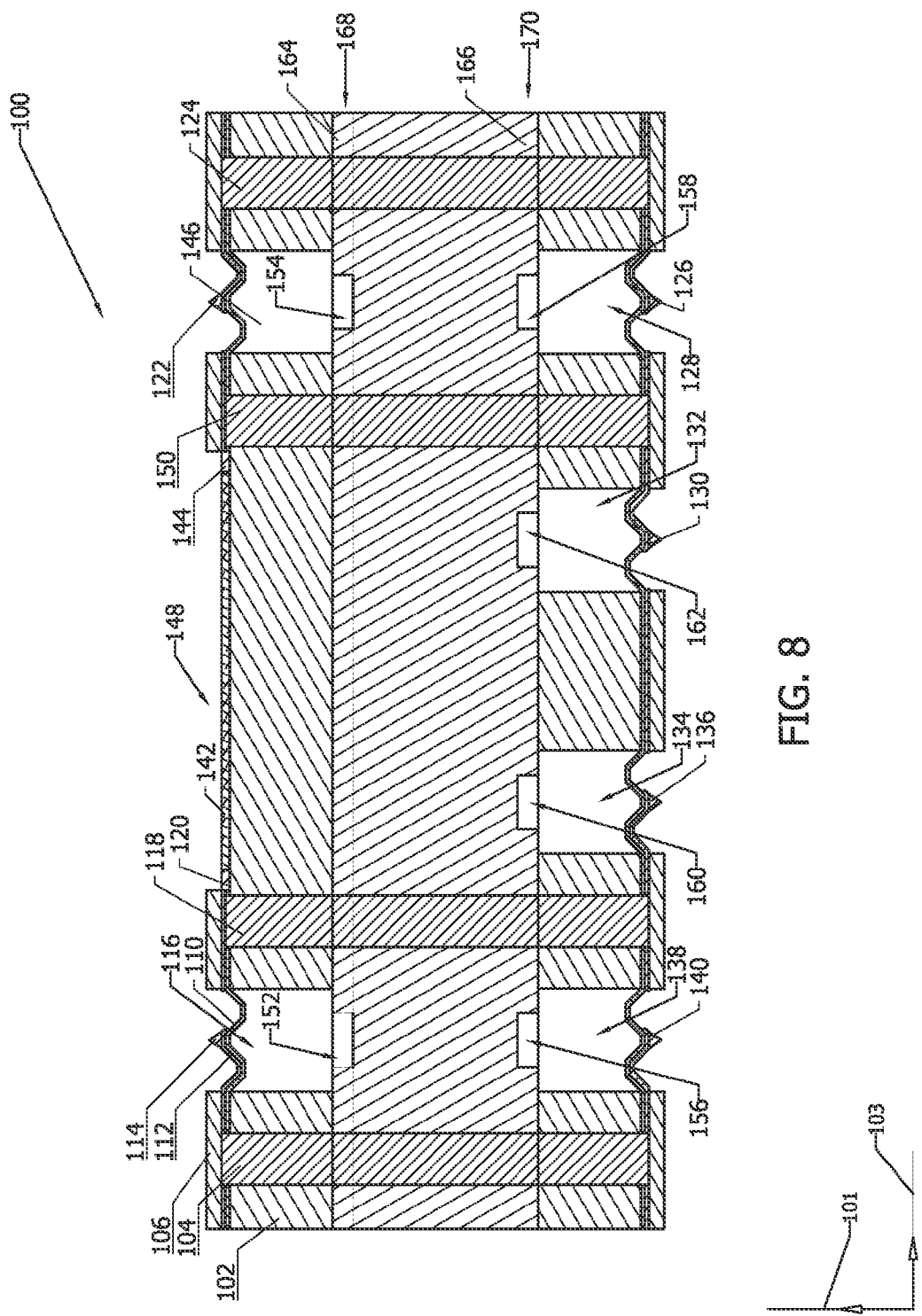
FIG. 8 is a cross-sectional view of the probe card of FIG. 6.

FIG. 6 is an upper-side isometric perspective view of a probe card 100 for testing functionality of a light-emitting diode (LED). FIG. 7 is a lower-side isometric perspective view of the probe card 100 of FIG. 6. FIG. 8 is a cross-sectional view of the probe card 100. The probe card 100 is a layered construction having an upper substrate 102 (FIG. 8), which may be formed of Type I material and in which two cavities 116 and 146 are expressly illustrated. An upper electrically insulating cover layer or spacer 106, which may be constructed of Type II material, defines the upper surface of the device 100 in FIGS. 6-9. A lower substrate, which may be formed of Type I material, is expressly illustrated as having four cavities 138, 134, 132 and 128. A lower electrically insulating cover layer or spacer, which may be constructed of Type III material, defines the lower surface of the probe card 100 in FIGS. 6-8.

A substrate body, which may be formed of Type I material, lies between the upper substrate 102 and lower substrate layers as shown in FIG. 8. Upper and lower openings 168 and 170 are formed in the substrate body to respectively permit fluid pressure application to upper and lower micro-fluidic channels 164 and 166 formed in the substrate body. The upper micro-fluidic channel 164 leads to cavity openings 152 and 154, through which fluid pressure in the upper cavities 116 and 146 is introduced and regulated.

A flexible membrane 110, which may be formed of Type II material, responds to the fluid pressure applied to the left-side upper cavity 116 and carries an electrical contactor 114, which may be formed of Type III material. A flexible conducting trace 112, which may be formed of Type III material, extends along the outer face of the membrane 110 to provide an electrical path from the electrical contactor 114 to a conducting or conductively plated pass-through connector 104, which may be formed of Type III material, and ultimately to a corresponding electrical contactor 140 at the lower side of the probe card 100.

The electrical contactor 114 moves with the flexible membrane 110 according to fluid pressure applied to the left-side upper cavity 116 at least partially in upward and downward Z directions, with reference to the Z-axis 101, which is normal to the upper surface of the probe card 100.

The flexible membrane 110 is advantageously formed as having a waving or undulating shape, which provides a greater range of motion of the contactor 114 than would likely be possible with a simple planar membrane. Below the position of the contactor 114, the flexible membrane 110 has a central frustum portion having its tapering apex or narrowing end extending or facing outward from the probe card 100. The flexible membrane 110 has an intermediate frustum portion that is concentric with and circumferentially encircles or surrounds the central frustum portion. The intermediate frustum portion has a tapering narrowing end extending or facing inward. The central frustum portion and intermediate frustum portion at least partially overlap along the Z-axis 101 such that the central frustum portion is at least partially nested within the intermediate frustum portion in at least the neutral position of the membrane in FIGS. 6-9.

That is, in the illustrated embodiment, the tip of the contactor 114 is positioned in or withdrawn into the probe card 100 until fluid pressure is introduced into cavity 116 through the channel 164 and cavity opening 152. To establish electrical connections, with the electrode pad 604 of the LED 600 in FIG. 9 for example, fluid pressure is introduced into cavity 116 to cause extension of the flexible membrane 110 thus carrying the tips of the contactor 114 outward from the probe card 100 and into electrical contact with the electrode pad 604.

A flexible membrane formed over the upper right-side cavity 146 is similarly constructed as the flexible membrane 110 and carries an electrical contactor 122 according to fluid pressure applied to the right-side upper cavity 146 at least partially in upward and downward Z directions, with reference to the Z-axis 101. A flexible conducting trace, which may be formed of Type III material, extends along the outer face of the membrane to provide an electrical path from the electrical contactor 122 to a conducting or conductively plated pass-through connector 124, which may be formed of Type III material, and ultimately to a corresponding electrical contactor 126 at the lower side of the probe card 100.

Along the lower side of the probe card 100 in FIG. 8, a flexible membrane formed over the lower left-side cavity 138 is similarly constructed as the flexible membrane 110 and carries the electrical contactor 140 according to fluid pressure applied to the cavity 138 at least partially in upward and downward Z directions, with reference to the Z-axis 101. A flexible conducting trace, which may be formed of Type III material, extends along the outer face of the membrane to provide an electrical path from the electrical contactor 140 to the pass-through connector 104. Thus, the upper left-side contactor 114 and lower left-side contactor 140 are maintained in electrical communication.

A flexible membrane formed over the lower right-side cavity 128 is similarly constructed as the flexible membrane 110 and carries the right-side electrical contactor 126 according to fluid pressure applied to the cavity 128 at least partially in upward and downward Z directions, with reference to the Z-axis 101. A flexible conducting trace, which may be formed of Type III material, extends along the outer face of the membrane to provide an electrical path from the electrical contactor 126 to the pass-through connector 124. Thus, the upper right-side contactor 122 and lower right-side contactor 126 are maintained in electrical communication.

While other uses may apply, the probe card 100 is particularly suited at least to test LED functionality. Along the central upper side of the probe card 100, an image sensor surface 148 of an image sensor cell 142 induces current through image sensor electrodes 120 and 144, which are maintained in electrical communication respectively with the lower side contactors 136 and 130 via respective pass-through connectors 118 and 150. The lower side contactors 136 and 130 are maintained in electrical communication with the respective pass-through connectors 118 and 150 via flexible conducting traces, which may be formed of Type III material, that extend respectively along the outer faces of the membranes across the lower central cavities 134 and 132. The membranes across the cavities 134 and 132 are similarly constructed as the flexible membrane 110 as already described in detail.

The lower micro-fluidic channel 166 leads to cavity openings 156, 160, 162 and 158 through which fluid pressure in the lower cavities 138, 134, 132 and 128 is introduced and regulated. Upon application of fluid pressure to the micro-fluidic channel 166, the flexible membranes formed across the lower cavities 138, 134, 132 and 128 respectively carry the electrical contactors 140, 136, 130 and 126, according to fluid pressure applied, at least partially in upward and downward Z directions, with reference to the Z-axis 101.

In the illustrated embodiment of FIG. 8, the tip of each membrane carried contactor 114, 122, 140, 134, 130 and 126 is positioned in or withdrawn into the probe card 100 until fluid pressure is introduced. Returning to the example of FIG. 9, an electrical connection can be established between upper left-side contactor 114 of the probe card 100 and the electrode pad 604 of the LED 600 by applying fluid pressure into cavity the 116 of the probe card 100 to cause extension of the flexible membrane 110 thus carrying the tip of the contactor 114 outward from the probe card 100 and into electrical contact with the electrode pad 604. Similarly, an electrical connection can be established between upper right-side contactor 122 of the probe card 100 and the electrode pad 606 of the LED 600 by applying fluid pressure into cavity the 146 causing extension the tip of the contactor 122 outward from the probe card 100 and into electrical contact with the electrode pad 606. In the illustrated embodiment, the left-side contactor 114 and the right-side contactor 122 are actuated by fluid pressure applied to the shared upper opening 168 and shared micro-fluidic channel 164, which leads to both of the cavities 116 and 146 via respective cavity openings 152 and 154. Separate micro-fluidic channels for independent control to the left-side contactor 114 and the right-side contactor 122 are within the scope of these descriptions as well. Similarly, in the illustrated embodiment, the lower contactors 140, 136, 130 and 126 are actuated by fluid pressure applied to the shared lower opening 170 and shared micro-fluidic channel 166, which leads to all of the lower cavities via respective cavity openings 156, 160, 162 and 158. Separate micro-fluidic channels for independent control of each lower contactor or in any combination are within the scope of these descriptions as well.

Figure 9:
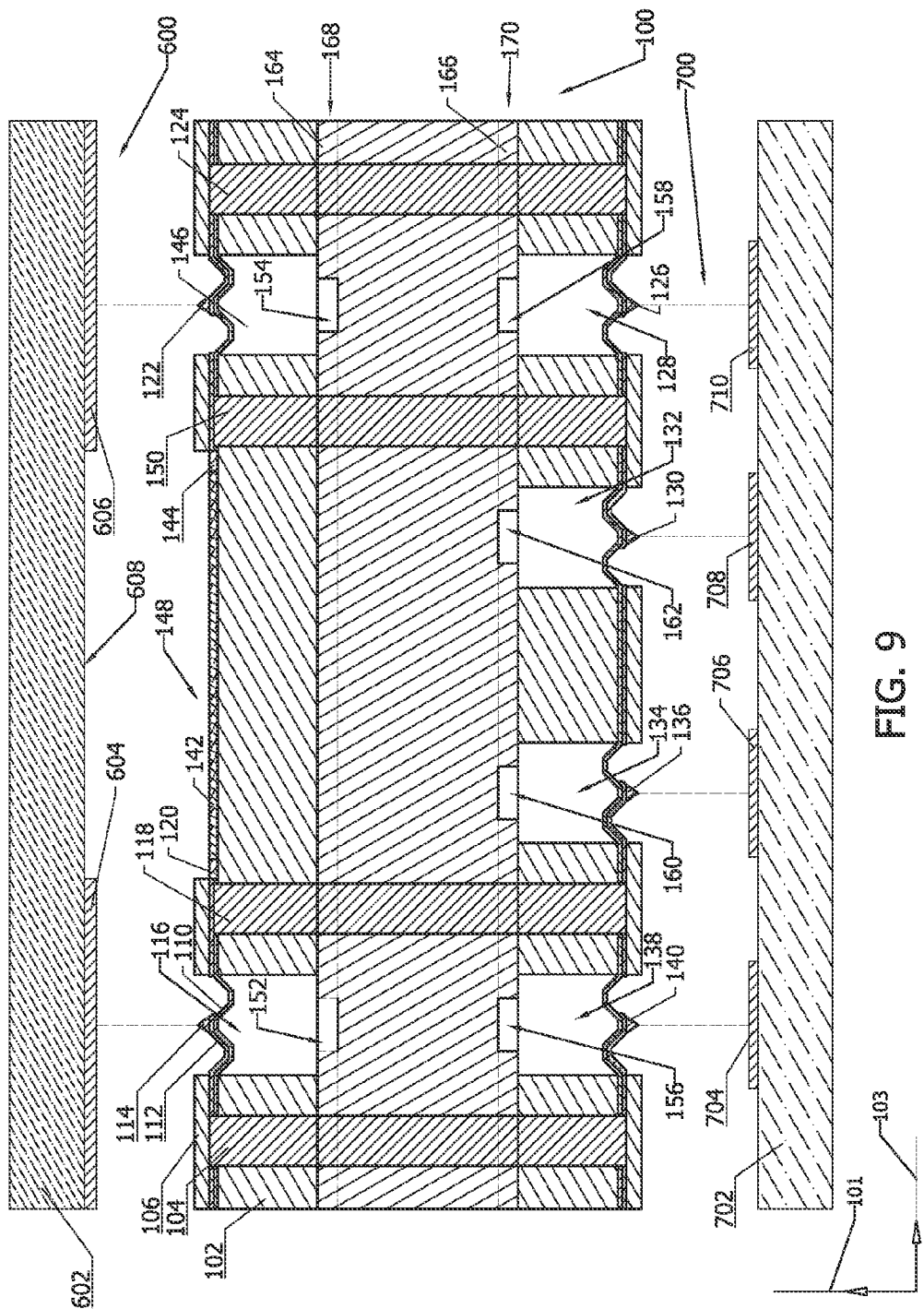
FIG. 9 is a cross-sectional view of a set up for testing an LED using the probe card of FIGS. 6-8.

FIG. 9 is a cross-sectional view of a set up for testing the functionality of the LED 600 using the probe card 100 of FIGS. 6-8. In the illustrated example, the LED 600 has a semiconductor substrate 602 and a light-emitting surface 608 which is activated upon the application of sufficient electrical voltage across the electrode pads 604 and 606, with which the left-side contactor 114 and right-side contactor 122 of the probe card 100 are respectively aligned. Similarly, along the lower side of the probe card 100, the electrical contactors 140, 136, 130 and 126 are aligned respectively with the electrode pads 704, 706, 708 and 710 of a device under test (DUT) board 700. The substrate 702 of the DUT board 700 may include one or more layers of electrical routing. The DUT board 700 is further connected to additional testing equipment or interconnecting equipment.

The left and right-side electrode pads 704 and 710 provide an electrical power circuit for activating the LED 600. The central electrode pads 706 and 708 provide a signal path for measuring/detecting the electrical response of the image censor cell 142 along the upper side of the probe card 100. In use, the probe card 100 is pressed between the LED 600 and the DUT board 700. With the probe card 100 contacting the LED 600 and the DUT board 700, electrical communication among the devices can be established by providing fluid pressure to the upper cavities 116 and 146, and to the lower cavities 138, 134, 132 and 128 of the probe card 100. Upon sufficient pressure being applied to any given cavity of the probe card 100, the respectively associated electrical contactor of the probe card 100 makes contact and electrically communicates with the respectively aligned electrode pad of the LED 600 or DUT board 700.

Once electrical communication is established among the devices, testing of the LED 600 can be conducted. The left and right-side electrode pads 704 and 710 of the DUT board 700 are in respective electrical communication with the electrode pads 604 and 606 of the LED 600 via the pass-through connectors 104 and 124 of the probe card 100, thus providing power to activate the LED 600. Once the LED 600 is powered up, if functioning properly, it will emit light which will be detected by the image sensor cell 142 of the probe card 100, inducing current flow through image sensor electrodes 120 and 144. The electrical signals of the image censor cell 142 of the probe card 100 responding to the illumination of the light-emitting surface 608 of the LED 600 are routed from the image sensor electrodes 120 and 144 respectively to the central electrode pads 706 and 708 of the DUT board 700 and are further passed from the DUT board to additional testing equipment or interconnecting equipment for signal measurement, analysis and diagnostics.

The cross-sectional views of the probe card 100 in FIGS. 8 and 9 are taken along a plane defined by the upper contactors 114 and 122 (FIG. 6) and lower contactors 140, 136, 130 and 126 (FIG. 7) of the probe card 100 in association with the image sensor cell 142. The upper contactors 114 and 122 are actuated by providing pressure into the opening 168, whereas the lower contactors 140, 136, 130 and 126 are actuated by providing pressure into the opening 170.

As shown in FIGS. 6 and 7, the probe card 100 has a repeating structure pattern in the Y-axis 105 direction. That is, similar or same structures as shown in FIGS. 8 and 9 reside in the regions of a second plane defined by upper contactors 1141 and 1221 (FIG. 6) and lower contactors 1401, 1361, 1301 and 1261 (FIG. 7) in association with an image sensor cell 1421 having image sensor electrodes 1201 and 1441 (FIG. 6). The upper contactors 1141 and 1221 are actuated by providing pressure into the opening 1681 (FIG. 6), whereas the lower contactors 1401, 1361, 1301 and 1261 (FIG. 7) are actuated by providing pressure into the opening 1701 (FIG. 6).

Furthermore, similar or same structures as shown in FIGS. 8 and 9 reside in the regions of a third plane defined by upper contactors 1142 and 1222 (FIG. 6) and lower contactors 1402, 1362, 1302 and 1262 (FIG. 7) in association with an image sensor cell 1422 having image sensor electrodes 1202 and 1442 (FIG. 6). The upper contactors 1142 and 1222 are actuated by providing pressure into the opening 1682 (FIG. 6), whereas the lower contactors 1402, 1362, 1302 and 1262 (FIG. 7) are actuated by providing pressure into the opening 1702 (FIG. 6).

Any number of similar or same repeating structures may be provided in embodiments of the probe card 100. For example, the image sensor cells 142, 1421 and 1422 may be solar cells or sensors responsive to different colors of light. In the illustrated embodiment, the probe card 100 includes three image sensor cells 142, 1421 and 1422, which are optically isolated from each other by the cover layer 106 during test procedures. These descriptions relate as well to any number of image sensor cells and associated electrical contacts.

In some embodiments, the probe card 100 provides cooling to the LED 600 in surface-to-surface contact with the probe card 100. For example, cooled liquid or cold gaseous fluid can be used to pressurize the micro-fluidic channels and cavities of the probe card 100, thus cooling the probe card 100 and with it the LED 600. It is also possible, due to the fact since there are no probings and probe stations involved, the whole setup can be placed in a chilled chamber, and can be tested without the need for heat sinks at the wafer level. The contactors of the testing set-up shown in FIG. 9 can also be multiplexed in similar ways as described with reference to FIGS. 4-5 in case a DUT board does not possess or cannot accept tighter space and electrode pad placement.

Regarding Type I material in the above descriptions, non-limiting examples include: silicon, glass, ceramics, non-conductive material, low CTE rigid or semi rigid polymers and epoxies, low CTE insulated metals or metal oxides. In at least one embodiment, referable Type I material includes low CET non-conductive material.

Regarding Type II material in the above descriptions, non-limiting examples include: flexible, electrically non-conductive, resilient material. The above-described membranes 306 and 326 (FIG. 2) and 110 (FIG. 8) and others can be constructed of one or more flexible and resilient materials including both electrically conducting and non-conducting materials. In one example construction, a membrane is constructed of parylene, and the trace and contactor carried by the membrane are formed of electrically conducting metal or alloy. Graphene, having advantageous strength and being highly electrically conductive, may be used in the construction of the membrane. Graphene can be used as a layer or trace upon a parylene layer. In such an example, the parylene electrically isolates the graphene from unwanted shorting or mutual connection among traces. The membrane can be a composite or layered membrane. For example, a first layer adjacent a substrate layers such as the upper substrate 302 and lower substrate 354 can be parylene, with a graphene layer upon the first layer to strengthen the membrane. In that example, any number of conducting or non-conducting layers can be added, so long as the top layer of the membrane is electrically non-conducting to permit independent electrical connection of each contactor tip and corresponding trace to a pass-through connector. Other conducting metals for use in or on the membranes include, but are not limited to, nickel and copper. The entire membrane could consist of conducting material, where electrical signals isolation is provided in the form on isolation rings or gaps around each membrane member. For example mono layers of graphene sandwiched between multiple very thin layers of conductive material (metals), where electrical conductivity and flexibility is maintained, while the strength of the conductive membrane is kept by its composite multilayer nature. Mono layer Graphene is very flexible, but imperfections make a mono layer graphene prone to breakage. Also a mono layer of graphene may not provide enough conductivity, while multiple layers of graphene on top of each other diminishes flexibility. The membrane material can also be graphene oxide and other composite membrane type. A benefit is to marginalize the role of spring constant and rather rely on the fluidic pressure to apply contact force. A very flexible membrane and metal trace, with zero spring constant is used in at least one embodiment.

Regarding Type III material in the above descriptions, non-limiting examples include: resilient conductive material such a copper, aluminum or other metal alloys and layers commonly used in microelectronics interconnect technology. As for the flexible conductive traces over the membrane, the material is thin enough to demonstrate flexing capabilities. A combinations of layers of very thin metals sandwiched between mono layers of graphene or graphene oxide may result in a very durable and flexible conductive material which will not go through plastic deformation or cracking during even hundreds of thousands of flexing cycles.

Figure 11:
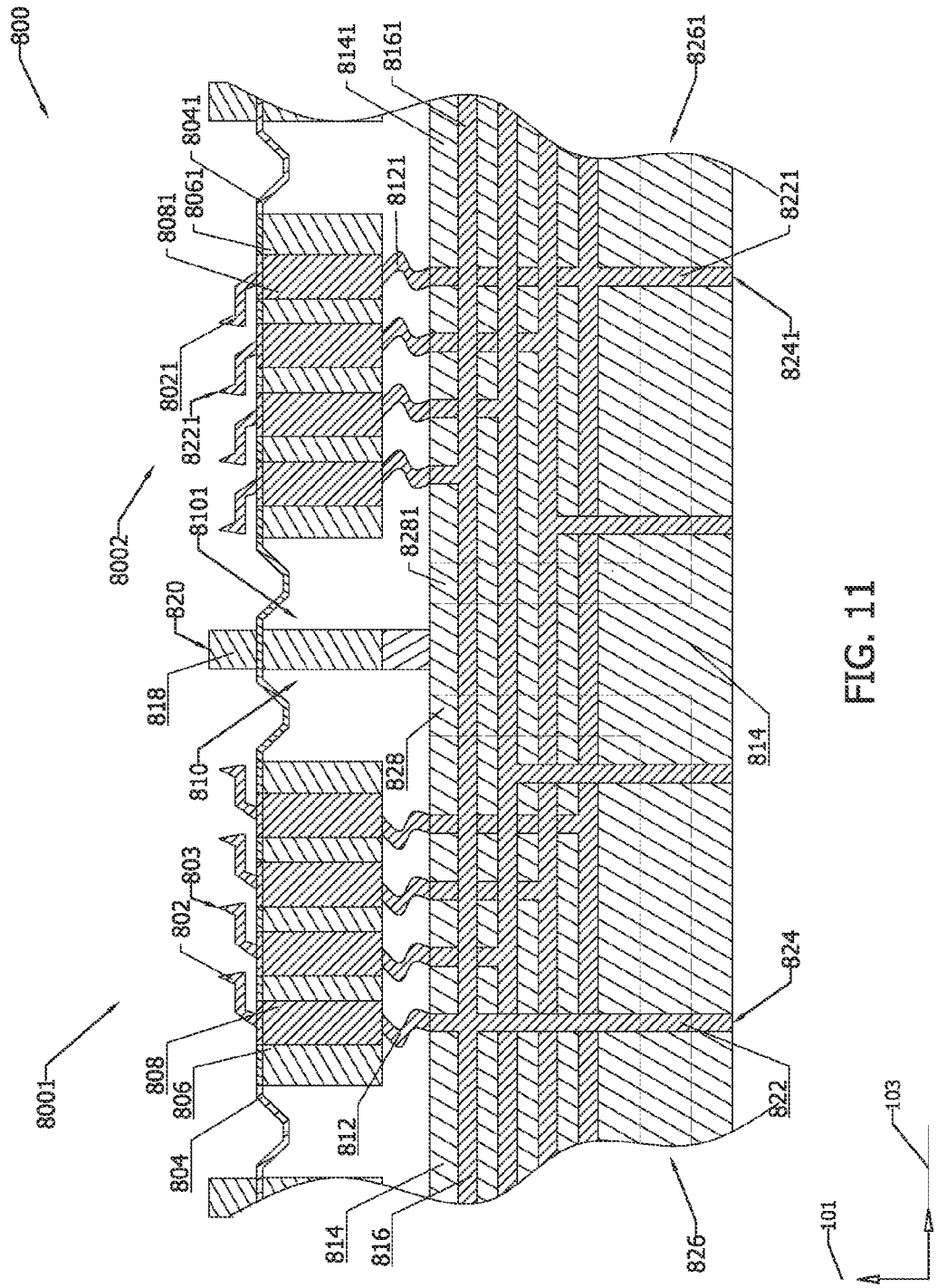
FIG. 11 is a cross-sectional view of a contactor and switch device according to at least one embodiment.
Figure 12:
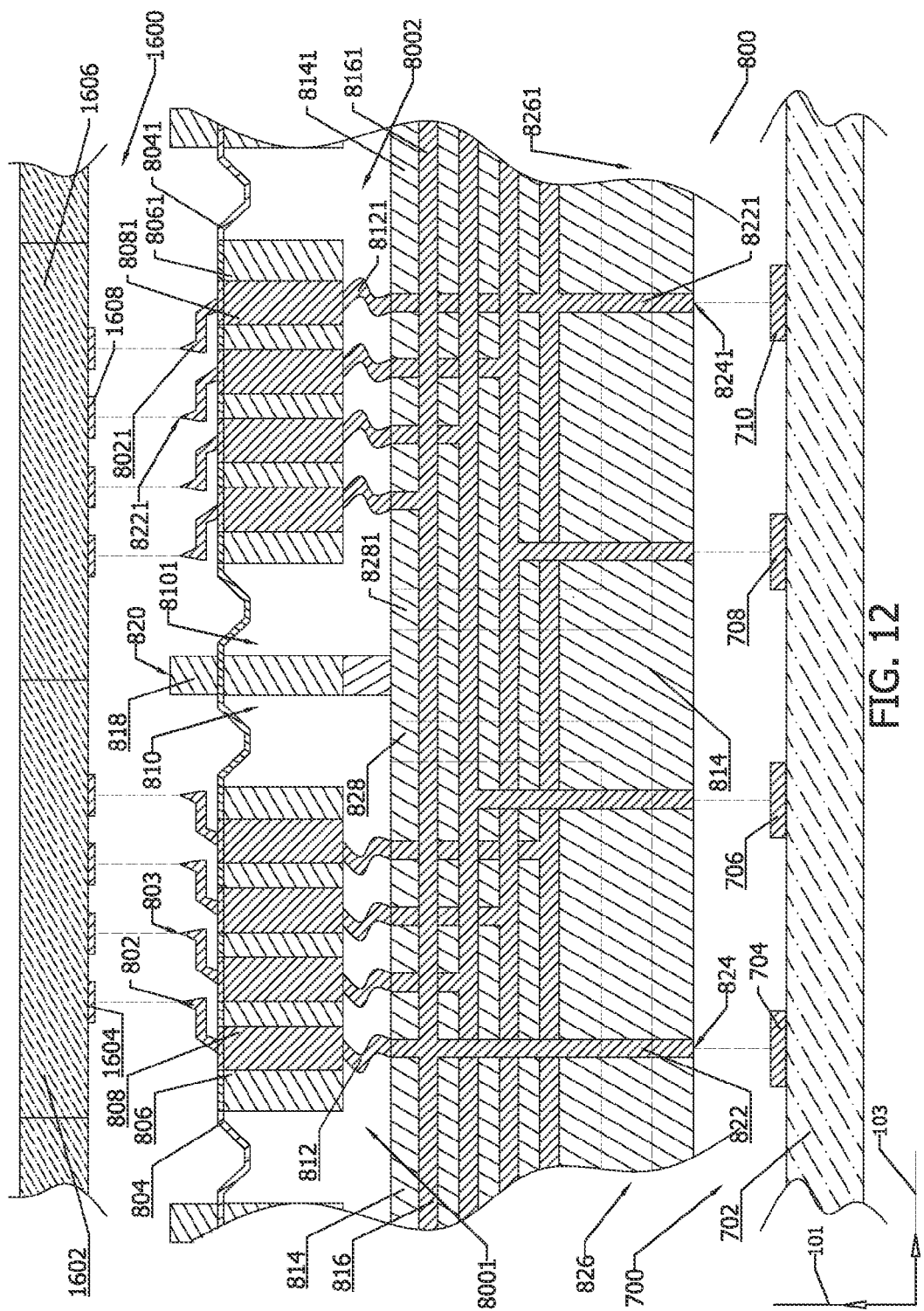
FIG. 12 is a cross-sectional view of a set up for testing a semiconductor chip using the contactor and switch device of FIG. 11.

FIG. 11 is a cross-sectional view of a fluid-pressure actuated contactor and switch device 800 according to at least one embodiment. FIG. 12 is a cross-sectional view of a set up for testing a semiconductor chip 1600 using the contactor and switch device 800 of FIG. 11. In the device 800 the flexible membrane 804 is formed to correspond to an individual dice foot print, instead of an individual contactor or groups of single contactors. The flexible membrane 804 is formed as a rectangular frustum around a contactors unit 8001 corresponding to a semiconductor chip wafer 1600 having electrodes along a foot print area of a particular dice 1602 (FIG. 12). The flexible membrane 8041 is formed as a rectangular frustum around a contactor unit 8002 corresponding to the semiconductor chip 1600 electrodes along a foot print area of an adjacent dice 1606 on the same wafer 1600. Each contactor unit 8001 and 8002 moves individually and independently relative to its neighboring units, thus eliminating or reducing problems associated with the Z-axis 101 tolerance of the wafer and probe card, while performing the task of multiplexing/switching between dice 1602 and 1606.

Flexible membrane 804 carries the contactor unit 8001 which has a cluster of outer contactors 802, 803, which may be formed of Type III material, and two adjacent contactors as shown in FIGS. 11-12 to represent that any number of contactors can be carried by the flexible membrane 804, which may be formed of Type II material. The contactor unit 8001 has a substrate 806, each of which may be formed of Type I material, through which conductive connectors maintain respective electrical connection between the outer contactors and inner flexible or springy leads. For example, the conductive connector 808 maintains electrical connection between the outer contactor 802 and inner lead 812.

Similarly, the flexible membrane 8041 carries the contactor unit 8002 (FIG. 11) which has a cluster of outer contactors 8021, 8221 and two adjacent contactors as shown in FIGS. 11-12 to represent that any number of contactors can be carried by the flexible membrane 8041, which may be formed of Type II material. The contactor unit 8002 has a substrate 8061 through which conductive connectors maintain respective electrical connections between the outer contactors and flexible or springy inner leads. For example, the conductive connector 8081 maintains electrical connection between the outer contactor 8021 and inner lead 8121. The outer contactors 802, 803, 8021, 8221 and others are formed as having an inner spring portion and outer contactor tip.

The inner leads 812, 8121 and others are further electrically connected to respective conductive lines routed through a body substrate having portions 814 and 8141 inward from cavities 810 and 8101. For example, the inner lead 812 extending from the contactor unit 8001 is electrically connected to a conductive line having extensions 816 and 8161 directed oppositely with reference to the X-axis 103. In some of the illustrated examples, the conductive lines routed through the body substrate 814 extend to the lower side of the device 800, opposite the upper surface 820, and connect to lower outer terminals. For example, the conductive line 822 electrically connects the inner lead 812 to the lower outer terminal 824. Similarly, the conductive line 8221 electrically connects the inner lead 8121 to the lower outer terminal 8241.

Micro fluidic channels 826 and 8261 formed in the body substrate 814 lead respectively to openings 828 and 8281 in cavities 810 and 8101. The flexible membranes 804 and 8041 respond to fluid pressure applied into the cavities 810 and 8101 through the openings 828 and 8281 respectively. By flexure of the flexible membranes 804 and 8041, the contactor units 8001 and 8002 move at least partially in inner and outer directions with reference to the Z-axis 101.

Micro fluidic channels 826 and 8261 may be connected to separate pressure sources for independent control of the contactor units 8001 and 8002.

An upper electrically insulating cover layer or spacer 818, which may be constructed of Type II material, defines the upper surface 820 of the device 800. In the illustrated embodiment of the device 800, the tips of the outer contactors 802, 803, 8021, 8221 and others are positioned in or withdrawn into the device 800 until fluid pressure is introduced into the cavities the cavities 810 and 8101, which may be pressured independently to establish electrical connections, at once, in any order, or according to any sequence of operations.

In the example of FIG. 12, when fluid pressure is introduced into the cavity 810 to cause extension of the flexible membrane 804 from its illustrated neutral position, the contactor unit 8001 is carried outward thus carrying the tips of the contactors 802 and 803 outward from the device 800 and into electrical contact with respective signal electrode pads of the semiconductor chip 1600. For example, the contactor 802 is carried into electrical contact with the signal electrode pad 1604 of the dice 1602 of the semiconductor chip 1600.

Similarly, when fluid pressure is introduced into the cavity 8101 to cause extension of the flexible membrane 8041 from its illustrated neutral position, the contactor unit 8002 is carried outward thus carrying the tips of the contactors 8021 and 8221 outward from the device 800 and into electrical contact with respective signal electrode pads of the semiconductor chip 1600. For example, the contactor 8221 is carried into electrical contact with the signal electrode pad 1608 of the dice 1606 of the semiconductor chip 1600.

Figure 13:
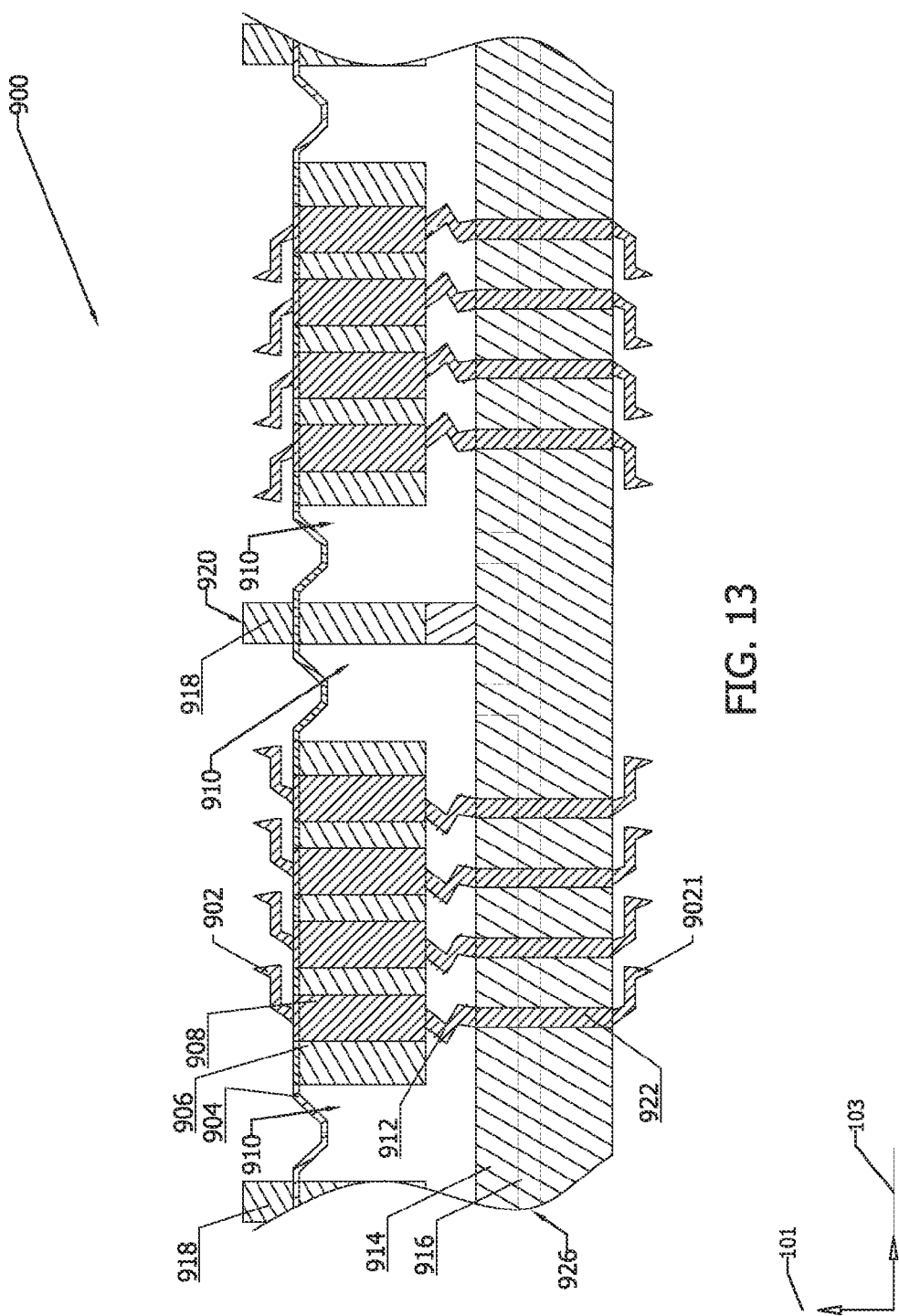
FIG. 13 is a cross-sectional view of a contactor device similar to that of FIG. 10, but having additional lower outer contactors according to at least one embodiment.

In the example of FIG. 12, along the lower side of the device 800, the lower outer terminals are aligned respectively with the electrode pads 704, 706, 708 and 710 of a device under test (DUT) board 700. The substrate 702 of the DUT board 700 may include one or more layers of electrical routing. The DUT board 700 is further connected to additional testing equipment or interconnecting equipment. For example, the lower outer terminal 824 is aligned to contact the electrode pad 704, and the lower outer terminal 8241 is aligned to contact the electrode pad 710. The lower outer terminals of the device 800 may connect permanently, for example using some sort of metal to metal connection such as solder balls, or temporarily by contact of lower outer contactors as shown in FIG. 13, in which the outer contactor 9021 and others are formed as having an inner spring portion and outer contactor tip. Different ways of connecting the device 800 to the DUT board 700 are within the scope of these descriptions. The DUT board 700 may be connected to additional testing equipment or interconnecting equipment for signal measurement, analysis and diagnostics of the semiconductor chip 1600.

Once electrical communication is established among the semiconductor chip 1600, device 800 and DUT board 700, testing of the semiconductor chip 1600 can be conducted. The left and right-side the contactor units 8001 and 8002 are pressured outward together, independently, or in any order, establishing connections between the tips of the outer contactors 802, 803, 8021, 8221 and others into respective electrical communication with the aligned signal electrode pads of the semiconductor chip 1600. This established electrical communication between the signal electrode pads of the semiconductor chip 1600 with respective electrode pads of the DUT board 700 according to the routing of the conductive lines of the device 800. For example, the signal electrode pad 604 establishes electrical communication with the electrode pad 704 of the DUT board 700 according to the routing of the conductive line 822.

During an example operation of the set-up of FIG. 12, assuming the semiconductor chip 1600, device 800 and DUT board 700 are in physical contact, but electrical communication is not established yet between the semiconductor chip 1600 and device 800, at a t=t1 positive pressure is inserted into the cavity 810, thus actuating the membrane 804 outward and establishing electrical contacts between the outer contactors of the contactor units 8001 with respective signal electrode pads of the dice 1602 of the semiconductor chip 1600. In this example operation, at the same time no pressure or negative pressure is applied to cavity 8101, preventing the electrical contact between the contactor unit 8002 with the dice 1602 of the semiconductor chip 1600. Based on the fact that either cavity 810 or 8101 can be pressurized, signal communication can be switched on and off between the the dice 1602 and 1606 of the semiconductor chip 1600 and the coarse pitch DUT board 700, one dice at a time. Pitch in this context refers to the distance between contacts.

Figure 10:
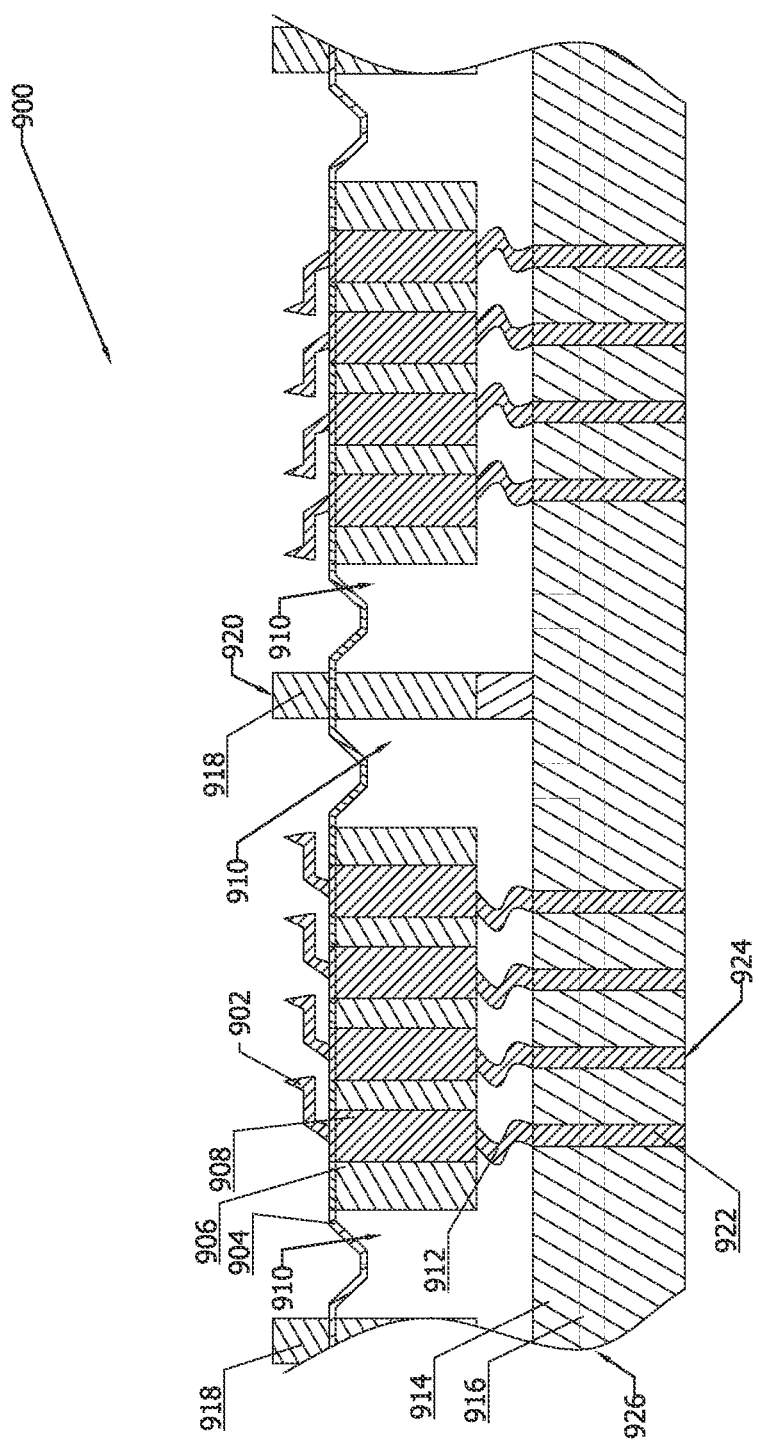
FIG. 10 is a cross-sectional view of a contactor device according to at least one embodiment.

FIG. 10 is a cross-sectional view of a fluid-pressure actuated contactor device 900 according to at least one embodiment. Like the device 800 of FIG. 11, the device 900 has flexible membranes, such as membrane 904 that, upon pressurization of their cavities 910, carry respective contactor units outward to extend outer contactors, such as outer contactor 902, outward from the device 900 relative to the upper the upper surface 920 of an electrically insulating cover layer or spacer 918, which may be constructed of Type II material, defines of the device 900. The outer contactors are each formed as having an inner spring portion and outer contactor tip.

Each contactor unit has a substrate, such as substrate 906 of the left-side contactor unit, which may be formed of Type I material, through which conductive connectors maintain respective electrical connection between the outer contactors and inner flexible or springy leads. For example, the conductive connector 908 maintains electrical connection between the outer contactor 902 and inner lead 912.

The inner leads are further electrically connected to respective conductive lines routed through a body substrate 914. For example, the inner lead 912 extends to a conductive line 922. The conductive lines routed through the body substrate 914 extend to the lower side of the device 900, opposite the upper surface 920, and connect to lower outer terminals, such as lower outer terminal 924.

A microfluidic channel 916 is formed in the body substrate 914 and leads to openings in cavities. The flexible membranes respond to fluid pressure applied into the cavities through respective openings. By flexure of the flexible membranes, the contactor units move at least partially in inner and outer directions with reference to the Z-axis 101. The microfluidic channel 916 is further connected to a pressure source via an outer opening 926. In FIG. 10, structures similar to those in FIG. 11 can be made according to materials described previously for each similar structure.

FIG. 13 is a cross-sectional view of a contactor device similar to that of FIG. 10, but having additional lower outer contactors according to at least one embodiment. The outer contactors, such as outer contactor 9021, are formed as having an inner spring portion and outer contactor tip.

The device 900 can be used for improved contact force and Z-axis tolerance alleviation, across a larger wafer, where otherwise, due to CTE mismatch the wafer and other devices bulge, thus causing significant Z-Axis tolerances.

Although the devices 800 (FIG. 11) and 900 (FIG. 10) are described above as having lower outer terminals, the devices 800 and 900 in other embodiments have lower actuating electrical contactors mounted on fluid-pressure actuated membranes as show for example in FIGS. 2 and 8. In such embodiment, the flexible membranes facilitate interfacing with the DUT board with temporary electrical connections instead of permanent connections such as by solder joint.

Particular embodiments and features have been described with reference to the drawings. It is to be understood that these descriptions are not limited to any single embodiment or any particular set of features, and that similar embodiments and features may arise or modifications and additions may be made without departing from the scope of these descriptions and the spirit of the appended claims.

What is claimed is:

1. A fluid pressure actuated device for establishing electrical contact, the device comprising:
   a first substrate side defining a first cavity;
   a first flexible membrane positioned across the first cavity, the first flexible membrane having an outer side facing a first direction away from the first substrate side, the first flexible membrane having an inner side facing into the first cavity in a second direction opposite the first direction; and
   an electrically conducting first contactor mounted on the outer side of the first flexible membrane;
   a second substrate side defining a second cavity;
   a second flexible membrane positioned across the second cavity, the second flexible membrane having an outer side facing the second direction away from the second substrate side, the second flexible membrane having an inner side facing into the second cavity in the first direction; and
   an electrically conducting second contactor mounted on the outer side of the second flexible membrane,
   wherein the first flexible membrane extends and withdraws moving the electrically conducting first contactor in the first direction and second direction respectively when fluid pressure is increased and decreased in the first cavity, and
   wherein the second flexible membrane extends and withdraws moving the electrically conducting second contactor in the second direction and first direction respectively when fluid pressure is increased and decreased in the second cavity.

2. A fluid pressure actuated device according to claim 1, wherein the first flexible membrane has an undulating shape.

3. A fluid pressure actuated device according to claim 1, wherein the first flexible membrane comprises at least one frustum portion.

4. A fluid pressure actuated device according to claim 1, wherein the first flexible membrane comprises at least two concentric frustum portions that narrow in opposite directions.

5. A fluid pressure actuated device according to claim 1, further comprising an electrically conducting connector in electrical communication with the first contactor and in electrical communication with the second contactor.

6. A fluid pressure actuated device according to claim 5, wherein the electrically conducting connector extends in the first and second directions.

7. A fluid pressure actuated device according to claim 5, further comprising:
   a third cavity formed in the first substrate side;
   a third flexible membrane disposed across the third cavity, the third flexible membrane having an outer side facing the first direction away from the first substrate side, the third flexible membrane having an inner side facing into the third cavity in the second direction; and
   an electrically conducting third contactor mounted on the outer side of the third flexible membrane, the third contactor in electrical communication with the electrically conducting connector,
   wherein the third flexible membrane extends and withdraws moving the electrically conducting third contactor in the first direction and second direction respectively when fluid pressure is increased and decreased in the third cavity.

8. A fluid pressure actuated device according to claim 1, wherein the fluid pressure actuated device has a first outer surface facing the first direction, and the first contactor has a neutral position in which the first contactor is positioned internally relative to the first outer surface until pressure is increased in the first cavity.

9. A fluid pressure actuated device according to claim 8, further comprising an electrically insulating cover layer between at least the electrically conducting connector and the first outer surface.

10. A fluid pressure actuated device according to claim 9, wherein the electrically insulating cover layer defines the first outer surface.

11. A fluid pressure actuated device according to claim 7, wherein when electrical signals are applied simultaneously to the first contactor and the third contactor, the electrically conducting connector mixes the signals and conveys a mixed signal to the second contactor.

12. A fluid pressure actuated device according to claim 1, wherein the fluid pressure actuated device is configured to test a light-emitting diode.

13. A fluid pressure actuated device according to claim 1, further comprising:
   an electrically conducting first connector in electrical communication with the first contactor and in electrical communication with the second contactor;
   an image sensor in which current is induced upon the image sensor being illuminated, the image sensor facing the first direction;
   a third cavity formed in the second substrate side;
   a third flexible membrane disposed across the third cavity, the third flexible membrane having an outer side facing the second direction away from the second substrate side, the third flexible membrane having an inner side facing into the third cavity in the first direction;
   an electrically conducting third contactor mounted on the outer side of the third flexible membrane; and
   an electrically conducting second connector in electrical communication with image sensor and the third contactor, the second connector electrically isolated from the first connector.

14. A fluid pressure actuated device for testing a light-emitting diode, the fluid pressure actuated device comprising:
   a first substrate side defining a first cavity;
   a first flexible membrane disposed across the first cavity, the first flexible membrane having an outer side facing a first direction away from the first substrate side, the first flexible membrane having an inner side facing into the first cavity in a second direction opposite the first direction; and
   an electrically conducting first contactor mounted on the outer side of the first flexible membrane;
   a second substrate side defining a second cavity;

a second flexible membrane disposed across the first cavity, the second flexible membrane having an outer side facing the second direction away from the second substrate side, the second flexible membrane having an inner side facing into the second cavity in the first direction; and an electrically conducting second contactor mounted on the outer side of the second flexible membrane;

an electrically conducting first connector in electrical communication with the first contactor and in electrical communication with the second contactor;

a first image sensor in which current is induced upon the image sensor being illuminated, the image sensor facing the first direction;

a third cavity formed in the second substrate side;

a third flexible membrane disposed across the third cavity, the third flexible membrane having an outer side facing the second direction away from the second substrate side, the third flexible membrane having an inner side facing into the third cavity in the first direction;

an electrically conducting third contactor mounted on the outer side of the third flexible membrane; and an electrically conducting second connector in electrical communication with the first image sensor and the third contactor, the second connector electrically isolated from the first connector.

15. A fluid pressure actuated device according to claim 14, wherein the first flexible membrane has an undulating shape.

16. A fluid pressure actuated device according to claim 15, wherein the first flexible membrane comprises at least two concentric frustum portions that narrow in opposite directions.

17. A fluid pressure actuated device according to claim 14, wherein the fluid pressure actuated device has a first outer surface facing the first direction, and the first contactor has a neutral position in which the first contactor is positioned internally relative to the first outer surface until pressure is increased in the first cavity.

18. A fluid pressure actuated device according to claim 17, wherein the electrically insulating cover layer defines the first outer surface.

19. A fluid pressure actuated device according to claim 17, wherein the first contactor delivers electrical power to a light emitting diode from the second contactor via the first connector.

20. A fluid pressure actuated device according to claim 14, further comprising a second image sensor optically isolated from the first image sensor.

* * * * *